US010147613B2

United States Patent
Chen et al.

(10) Patent No.: US 10,147,613 B2
(45) Date of Patent: *Dec. 4, 2018

(54) NEUTRAL BEAM ETCHING OF CU-CONTAINING LAYERS IN AN ORGANIC COMPOUND GAS ENVIRONMENT

(71) Applicant: TOKYO ELECTRON LIMITED, Tokyo (JP)

(72) Inventors: Lee Chen, Cedar Park, TX (US); Audunn Ludviksson, Seattle, WA (US)

(73) Assignee: Tokyo Electron Limited, Tokyo (JP)

( * ) Notice: Subject to any disclaimer, the term of this patent is extended or adjusted under 35 U.S.C. 154(b) by 126 days.

This patent is subject to a terminal disclaimer.

(21) Appl. No.: 14/319,927

(22) Filed: Jun. 30, 2014

(65) Prior Publication Data

US 2015/0380271 A1    Dec. 31, 2015

(51) Int. Cl.
| | |
|---|---|
| H01L 21/3213 | (2006.01) |
| H01L 21/768 | (2006.01) |
| H01L 21/3205 | (2006.01) |
| H01L 21/285 | (2006.01) |
| H01L 21/02 | (2006.01) |
| H01L 23/532 | (2006.01) |

(52) U.S. Cl.
CPC .. *H01L 21/32136* (2013.01); *H01L 21/02063* (2013.01); *H01L 21/28562* (2013.01); *H01L 21/32051* (2013.01); *H01L 21/32135* (2013.01); *H01L 21/76807* (2013.01); *H01L 21/76814* (2013.01); *H01L 21/76838* (2013.01); *H01L 21/76849* (2013.01); *H01L 21/76879* (2013.01); *H01L 23/53238* (2013.01)

(58) Field of Classification Search
CPC ......... H01L 21/76814; H01L 21/02063; H01L 21/76807; H01L 21/76838; H01L 21/76849; H01L 23/53238; H01L 21/32135; H01L 21/76879; H01L 21/28562; H01L 21/32051; H01L 21/76861; H01L 21/32136
See application file for complete search history.

(56) References Cited

U.S. PATENT DOCUMENTS

| | | | |
|---|---|---|---|
| 5,271,800 | A | 12/1993 | Koontz et al. |
| 5,336,363 | A | 8/1994 | Morita |

(Continued)

FOREIGN PATENT DOCUMENTS

JP    2010-027788 A    2/2010

OTHER PUBLICATIONS

International Search Report dated Sep. 18, 2015 in PCT/US2015/034170 filed Jun. 4, 2015.

(Continued)

*Primary Examiner* — Bac Au
(74) *Attorney, Agent, or Firm* — Oblon, McClelland, Maier & Neustadt, L.L.P.

(57) ABSTRACT

A method and apparatus for dry etching pure Cu and Cu-containing layers for manufacturing integrated circuits. The invention uses a directional beam of O-atoms with high kinetic energy to oxidize the Cu and Cu-containing layers, and organic compound etching reagents that react with the oxidized Cu to form volatile Cu-containing etch products. The invention allows for low-temperature, anisotropic etching of pure Cu and Cu-containing layers in accordance with a patterned hard mask or photoresist.

19 Claims, 4 Drawing Sheets

(56) References Cited

U.S. PATENT DOCUMENTS

| | | | |
|---|---|---|---|
| 5,350,484 A | 9/1994 | Gardner et al. | |
| 5,993,679 A | 11/1999 | Koide et al. | |
| 6,284,052 B2 | 9/2001 | Nguyen et al. | |
| 6,331,701 B1 | 12/2001 | Chen et al. | |
| 6,352,081 B1 | 3/2002 | Lu et al. | |
| 6,921,722 B2 * | 7/2005 | Ogure | C23C 16/18 216/65 |
| 7,214,327 B2 | 5/2007 | Chen et al. | |
| 7,781,340 B2 * | 8/2010 | Chen | H01L 21/28185 438/689 |
| 8,951,908 B2 * | 2/2015 | Hara | H01L 23/53238 257/E21.585 |
| 2002/0072016 A1 | 6/2002 | Chen et al. | |
| 2005/0224456 A1 | 10/2005 | Chen et al. | |
| 2006/0121733 A1 * | 6/2006 | Kilpela | C23C 16/18 438/681 |
| 2009/0042384 A1 * | 2/2009 | Miyoshi | H01L 21/02063 438/627 |
| 2010/0099254 A1 * | 4/2010 | Narushima | C23C 16/44 438/668 |
| 2010/0173494 A1 | 8/2010 | Kobrin | |
| 2013/0075248 A1 | 3/2013 | Hara et al. | |
| 2013/0203260 A1 | 8/2013 | Hara et al. | |
| 2013/0306597 A1 | 11/2013 | Gunji et al. | |

OTHER PUBLICATIONS

Office Action dated Feb. 18, 2017 in co-pending Taiwan Application No. 104120679 (with English translation).

Extended European Search Report dated Feb. 16, 2018 in Patent Application No. 15814512.8, citing documents AA and AX-AY therein, 9 pages.

Takanori Suda, et al. "Development of Cu Etching using $O_2$ Cluster Ion Beam under Acetic Acid Gas Atmosphere", The Japan Society of Applied Physics, vol. 51, No. 8, XP002777904, 2012, 6 pages.

Sang Ki Nam, et al. "Generation of Fast Neutral Beams by Ion Neutralization in High-Aspect-Ratio Holes: A Particle-in-Cell Simulation Study", IEEE Transactions on Plasma Science, vol. 35, No. 5, XP011193804, 2007, pp. 1370-1378.

* cited by examiner

NEUTRAL BEAM ETCHING OF CU-CONTAINING LAYERS IN AN ORGANIC COMPOUND GAS ENVIRONMENT

BACKGROUND OF THE INVENTION

Field of the Invention

The present invention relates to the field of semiconductor processing and more particularly to a method and apparatus for anisotropic etching and patterning of pure Cu and Cu-containing layers used in integrated circuits.

Description of the Related Art

Copper (Cu) is emerging as the metal of choice in a wide variety of semiconductor applications. Lower electrical resistivity, coupled with improved electromigration performance and increased stress migration resistance are important material properties that favor the use of Cu over aluminum (Al) in interconnect lines and contacts. The lower electrical resistance is critical since it allows signals to move faster by reducing the RC time delay. The superior resistance to electromigration, a common reliability problem in Al lines, means that Cu can handle higher power densities. An equally important benefit of using Cu over Al is that the manufacturing cost for a Cu metallization scheme can be lower due to new processing methods that reduce the number of manufacturing steps and alleviate the need for some of the most difficult steps.

The capability to process substrates anisotropically permits the production of integrated circuit features at precisely defined locations with sidewalls that are essentially perpendicular to the surface of a masked overlayer. The introduction of Cu into multilevel metallization architecture requires new processing methods for Cu patterning. Because Cu is difficult to dry etch, new process schemes have been developed for Cu patterning.

The damascene approach is based on etching features in the dielectric material, filling them with Cu metal, and planarizing the top surface by chemical mechanical polishing (CMP). Dual damascene schemes integrate both the contacts and the interconnect lines into a single processing scheme. However, Cu CMP technology is challenging and it has difficulty defining extremely fine features. In addition, CMP suffers from yield-detracting problems of scratching, peeling, dishing and erosion.

An alternative to the damascene approach is patterned etching of a Cu layer. The patterned etch process involves deposition of a Cu layer on a substrate, the use of a patterned hard mask or photoresist over the Cu-containing layer, patterned etching of the Cu layer using a reactive ion etching (RIE) process; and deposition of dielectric material over the patterned Cu-containing layer. Patterned etching of Cu can have advantages over damascene processes since it is easier to etch fine Cu patterns and then deposit a dielectric layer onto the Cu pattern, than it is to get barrier layer materials and Cu metal to adequately fill small feature openings in a dielectric film.

Patterned etching using RIE processes is characterized by relatively low pressures and high ion bombardment energies. While ion bombardment is needed to achieve the desired degree of etch anisotropy, it is also responsible for secondary damage to the underlying microstructure. As semiconductor devices have become increasingly more integrated and new advanced materials, such as copper and low-k dielectric materials, have been introduced to improve the circuit properties, the damage caused by fabrication processes presents an increasingly serious problem. A leading reason for damage formation is essentially the incidence of energetic particles, such as ions and UV photons, from the plasma environment to the substrate surface.

The primary etch reagent for removing Cu layers is traditionally a chorine-containing gas in gas mixture that includes argon (Ar). Removal of pure Cu layers and Cu-containing layers with high Cu-content using chlorine plasma essentially involves physical sputtering of the low-volatility $CuCl_x$ surface layer by energetic ions in the plasma. The Cu removal rates are very low when using this method and another drawback is that the sputtered $CuC_x$ coats the chamber walls and this requires periodic cleaning of the etching chamber. An equally serious problem is encountered when high-aspect-ratio features are etched in chlorine plasma and the sputtered $CuCl_x$ products redeposit on the feature sidewalls where the effects of physical sputtering are reduced.

When the abovementioned chlorine-based etching process is carried out at elevated temperatures (>200° C.) to increase the volatility of the reacted Cu-containing layer, corrosion can occur due to the accumulated $CuCl_x$ etch residues on the surface. If these residues are not removed by a post-etch cleaning step, they can cause continuing corrosion of the Cu even after the application of a protective layer over the etched features.

Other energy sources have been suggested to increase the etching rate. These approaches include exposing the etching surface to UV or IR light sources to accelerate desorption of $CuCl_x$ from the etching surface. However, these approaches are not practical for semiconductor batch processing of large substrates due to poor etch uniformity, high cost and added equipment complexity, and reliability problems.

Accordingly, it is desirable to develop a method for anisotropic etching in semiconductor manufacturing using plasmas that are essentially free of energetic ions and photon particles. Such particles are ordinarily required to achieve anisotropic etch with atomic oxygen plasmas in the prior art, but cause secondary damage to the underlying substrate. Furthermore, the reaction products should be highly volatile and easily removed from the etched substrate. In addition, the aforementioned limitations that are encountered when etching Cu-containing layers using conventional chlorine chemistry, show that there is a need for new low temperature dry etching methods in semiconductor manufacturing using chemical approaches that do not involve chlorine-based reactants.

SUMMARY OF THE INVENTION

It is an object of the present invention to provide a method and an apparatus for anisotropic dry etching of pure Cu layers and Cu-containing layers used in integrated circuits.

The above and other objects are achieved, according to the present invention, by providing a method and an apparatus that uses a directional beam of high kinetic energy (hyperthermal) neutral O-atoms to anisotropically oxidize Cu layers, and an etching gas comprising an organic compound gas such as $CH_3COOH$ that readily reacts with the oxidized Cu layers to form volatile Cu-containing etch products. The high directionality of the O-atom beam allows for anisotropic etching of the Cu layers in accordance with a patterned hard mask or photoresist.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
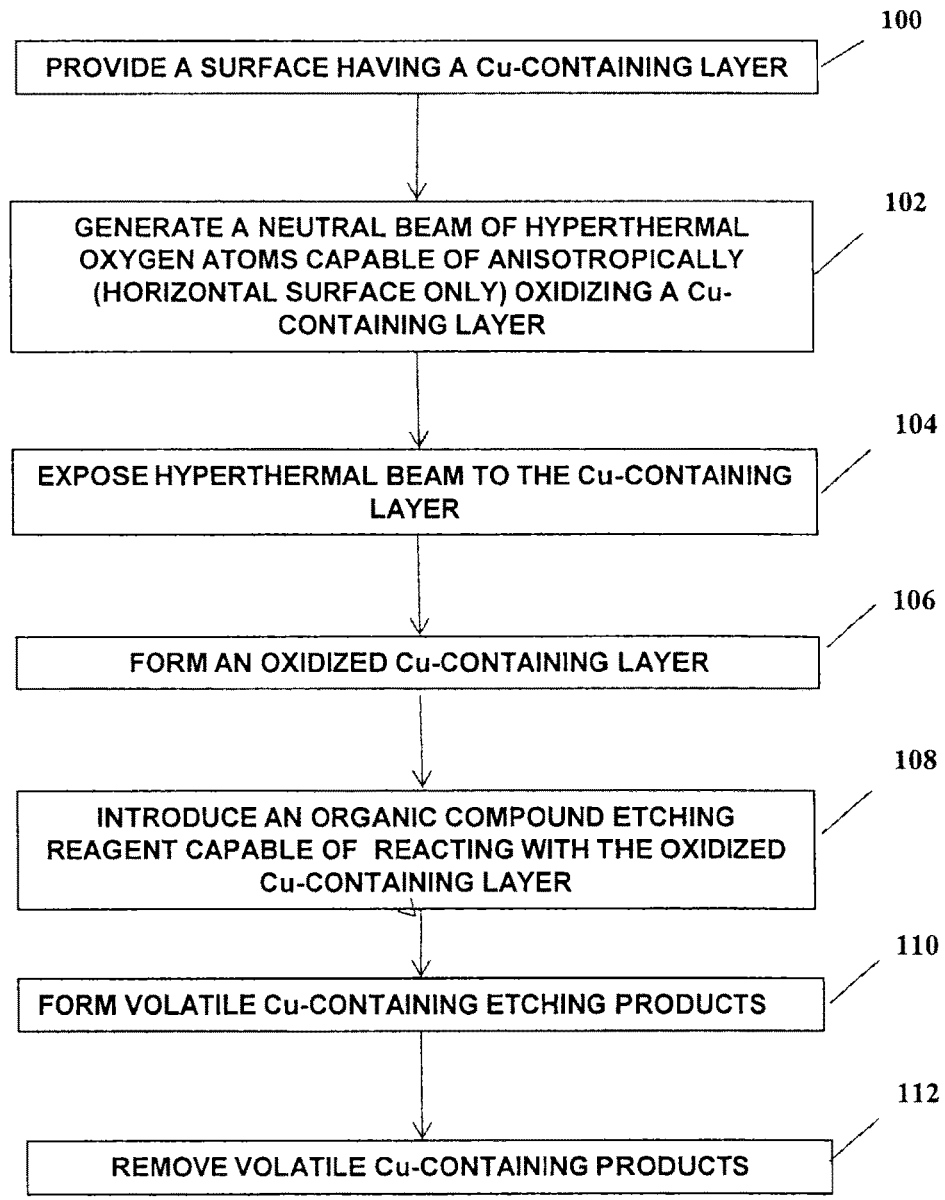
FIG. 1 is a flowchart for etching a Cu-containing layer in accordance with the present invention.

Referring now to the drawings, wherein like reference numerals designate identical or corresponding parts throughout the several views.

In general, the present invention pertains to a method and an apparatus for etching pure Cu and Cu-containing layers in manufacturing integrated circuits. The method uses a directional beam of high kinetic energy O-atoms to oxidize the Cu layers, and an etch reagent that forms volatile Cu-containing etch products when reacted with the oxidized Cu layers.

Importantly, the etch reagent reacts very slowly with unoxidized Cu on feature sidewalls, but reacts readily with oxidized Cu surfaces at low temperatures. Therefore, in order to achieve anisotropic etching and avoid undercutting of etch features, the oxidation rate of Cu on the vertical sidewalls of the etch features must be substantially slower than the oxidation of Cu on the horizontal surfaces. This is achieved using a directional O-atom beam.

The directional beam is preferably a hyperthermal beam of neutral O-atoms that has high kinetic energy and can be produced with low divergence from the substrate normal, thereby allowing production of masked structures with reduced ion damage and charge build-up problems often encountered in plasma processes.

In general, hyperthermal atomic beams contain neutral atoms that have high kinetic energy ($E_k \geq 1$ eV) compared to thermalized atoms ($E_k \sim 0.05$ eV) produced by conventional glow discharge devices, such as plasma ashers and sputter etching apparatus. The kinetic energy of hyperthermal atomic beams can be as high as several hundred eV.

The use of hyperthermal O-atom beams to oxidize and etch films has been shown to result in reduced ion bombardment damage and charge-induced damage that is commonly observed during plasma etching processes, such as reactive ion etching (RIE). For example, hyperthermal O-atoms have been used for anisotropic etching in semiconductor manufacturing, particularly in the areas of photoresist stripping and multilayer lithography applications, with little or no secondary damage to the underlying substrate.

Koontz and Cross in U.S. Pat. No. 5,271,800 entitled "Method for anisotropic etching in the manufacture of semiconductor devices," disclose a method for anisotropic etching of a hydrocarbon polymer coating using a beam of hyperthermal atomic oxygen, to generate a desired pattern on a semiconductor wafer. The hyperthermal beam has kinetic energy in the range between about 0.2 eV to 20 eV and is produced using a continuous optical discharge laser.

In the current invention, the use of a hyperthermal beam of neutral O-atoms to oxidize Cu layers and Cu-containing layers and subsequent reaction of the oxidized layers with etch reagents to form Cu-containing etch products, allows for anisotropic etching at low substrate temperatures. In one embodiment, the hyperthermal beam of O-atoms is generated in a separate chamber from the processing (etching) chamber and the beam contains only neutral O-atoms when it enters the processing chamber. Alternatively, the O-atom beam is generated inside the processing chamber. The etch reagent is introduced into the processing chamber using effusive sources and is therefore not exposed to a plasma source that could result in deleterious decomposition of the etch reagent prior to reaction with the oxidized Cu layers.

FIG. 1 is a flowchart for etching a Cu-containing layer in accordance with the present invention. Step 100 provides a surface having a Cu-containing layer to be etched in a process chamber. In step 102, a beam of hyperthermal oxygen atoms is generated that is capable of anisotropically oxidizing the Cu-containing layer. The beam of neutral O-atoms is exposed to the Cu-containing layer in step 104 and an oxidized Cu-containing layer is formed in step 106. An etching reagent capable of reacting with the oxidized Cu-containing layer is introduced into the process chamber in step 108. Volatile Cu-containing etching products are formed from the reaction of oxidized Cu-containing layers with the etch reagent in step 110 and are removed from the Cu-containing layer in step 112. Desorption of the etching products from the etching surface is aided by surface bombardment of the energetic O-atoms. The Cu-containing layer is exposed to the beam of O-atoms and the etching gas for a time period that enables desired etching of the Cu-containing layer.

Figure 2A:
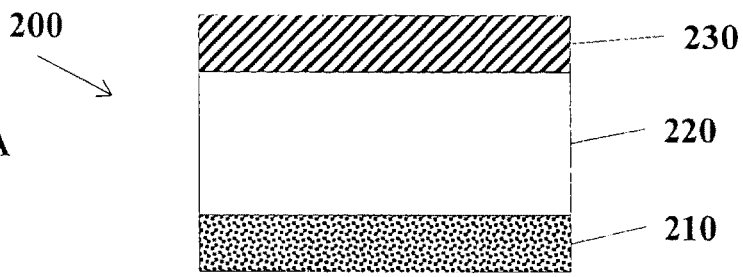
FIGS. 2a-2d show a schematic cross-sectional representation of anisotropic etching of Cu-containing layers in accordance with the present invention.
Figure 2B:
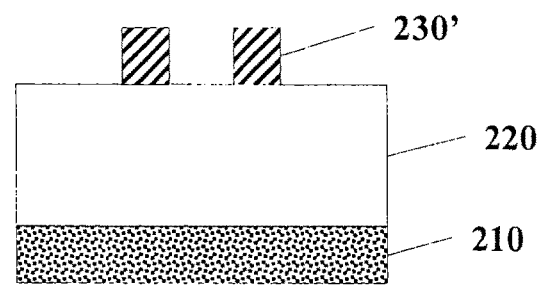
Figure 2C:
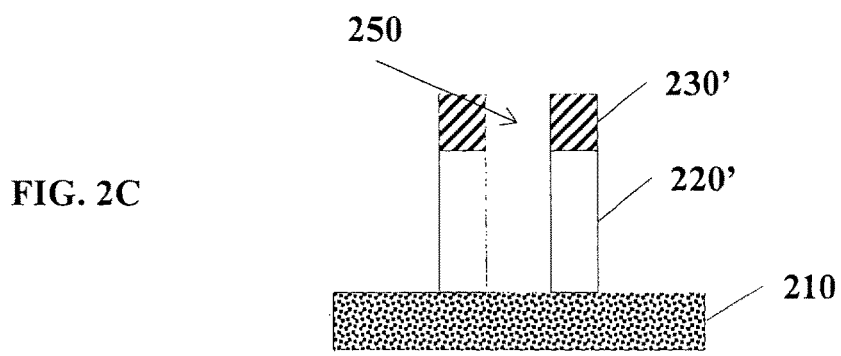
Figure 2D:
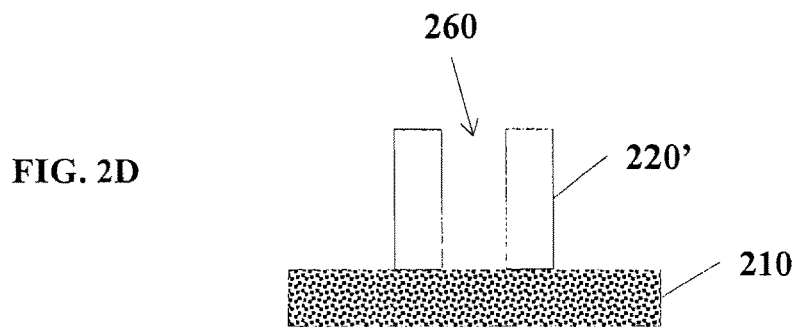

FIGS. 2a-2d show a schematic cross-sectional representation of anisotropic etching of Cu-containing layers in accordance with the present invention. FIG. 2a shows a partially completed integrated circuit. The segment 200 comprises a substrate 210, a Cu-containing layer 220, and a hardmask or photoresist material 230 completes the structure. In order to achieve anisotropic etching of a Cu-containing layer, a resist material overlying the Cu-containing layer is required that is resistant to a beam of hyperthermal 0-atoms. Examples of such resist materials are polysiloxane-containing resists that are processed using electron-beam exposure in the presence of a mask overlay. The segment 200 in FIG. 2a is processed using conventional patterning methods known in the art to produce the pattern in FIG. 2b. Further anisotropic etching of the structure in FIG. 2b according to the present invention etches the Cu-containing layer 220 While preserving the vertical geometry of the structure defined by the photoresist pattern 230', forming the structure shown in FIG. 2c. Continued processing as is conventional in the art, removes the remaining photoresist pattern 230', resulting in the patterned Cu-structure 220' shown in FIG. 2d.

Figure 3:
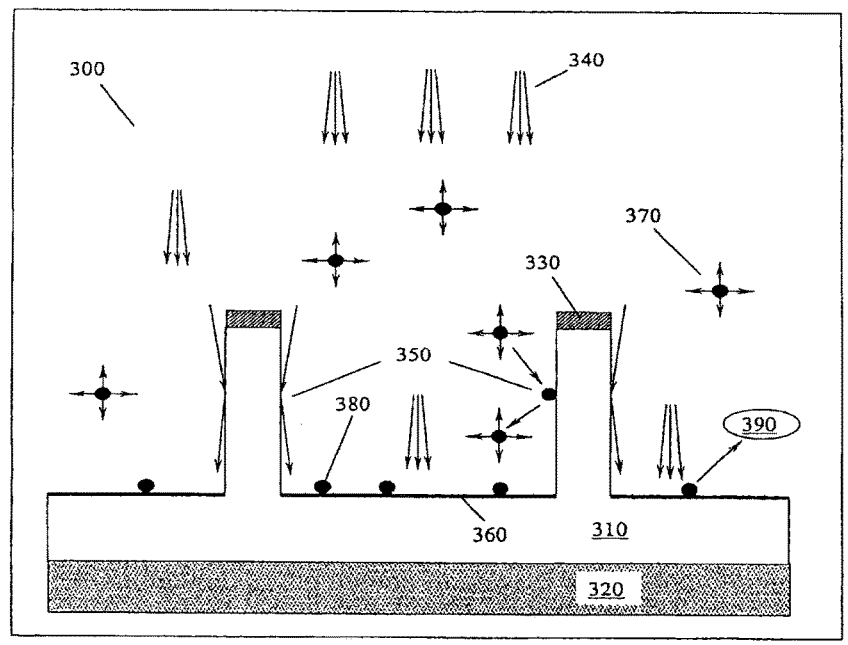
FIG. 3 shows a schematic cross-sectional representation of anisotropic etching of Cu-containing layers in accordance with the present invention.

FIG. 3 shows a schematic cross-sectional representation of anisotropic etching of Cu-containing layers in accordance with the present invention. FIG. 3 schematically illustrates characteristics of the etching process that allow for anisotropic etching of Cu-containing layers. The segment 300 shows a partially completed integrated circuit that comprises a Cu-containing layer 310 overlaying a substrate 320 and a photoresist pattern 330 overlying the Cu-containing layer 310. Anisotropic etching of the structure in FIG. 3 removes the Cu-containing layer 310 while preserving the vertical geometry of the structure defined by the photoresist pattern 330.

The neutral O-atoms in a hyperthermal beam are schematically represented by arrows 340 in FIG. 3. A beam of hyperthermal O-atoms that has a low divergence from the substrate normal is depicted using near vertical arrows. The directionality and high kinetic energy of the O-atoms results in elastic forward scattering from the vertical surfaces (sidewalls) 350 and therefore low probability of sidewall oxidation. In other words, the residence time of the O-atoms on the sidewalls is too short and the kinetic energy in the direction normal to the sidewalls is insufficient to result in oxidation of the sidewalls 350. In contrast, O-atoms impinging on the horizontal surfaces have enough kinetic energy and a residence time that is long enough to form an oxidized Cu layer 360. An etching gas containing the etch reagent 370 is introduced into the etching chamber separate from the O-atom source using effusive nozzles and the interaction of the etch reagent 370 with the segment 300 is therefore isotropic. The etch reagent 370 is chosen so that it does not react with unoxidized Cu on the sidewalls 350.

In contrast, when the etch reagent 370 adsorbs onto the oxidized Cu layer 360 forming the adsorbed etch reagent 380, it reacts spontaneously, even at low temperature, with the oxidized Cu layer. In addition to exposure to the etch reagent 370, the horizontal surfaces of Cu layer 360 are under constant energetic O-atom bombardment 340, which, in addition to oxidizing the surface, further aids desorption of etch products 390 from the surface and allows etching of Cu-containing layers at low temperatures.

The kinetic energy of the O-atoms affects the oxidation of the horizontal surfaces. When O-atoms with high kinetic energy interact with the horizontal surfaces, the O-atoms penetrate the surface layer, loose their kinetic energy (become thermalized) as they become embedded in the surface layer, and thereby oxidize the surface layer. If the kinetic energy is below a certain threshold energy, the O-atoms are more likely to "bounce back" without becoming thermalized, and this can result in undesired sidewall oxidation and sidewall etching.

Process conditions that enable the desired etching of the Cu-containing layer in the current invention may be determined by direct experimentation and/or design of experiments (DOE). For example, adjustable process parameters can comprise the kinetic energy of the O-atoms in the hyperthermal beam, substrate temperature, process pressure, choice of process gases and relative gas flows of the process gases.

The etch reagent gas is preferably an organic compound gas. As for the organic compound, it is preferable to use one that can be supplied as it is or in a gaseous state by heating to the plasma processing system maintained in a vacuum state. Typically, an organic acid is used. As for the organic acid, it is preferable to use a carboxylic acid represented by an acetic acid (general formula: R—COOH, R being hydrogen or straight-chain or branched-chain alkyl or alkenyl of C1 to C20, preferably methyl, ethyl, propyl, butyl, pentyl, or hexyl). The carboxylic acid other than the acetic acid may include formic acid (HCOOH), propionic acid ($CH_3CH_2COOH$), butyric acid ($CH_3(CH_2)_2COOH$), valeric acid ($CH_3(CH_2)_3COOH$) or the like. Among the carboxylic acids, the formic acid, the acetic acid, and the propionic acid are more preferably used.

When the organic compound is acetic acid, the reaction between copper oxide and acetic acid is accelerated, and volatile $Cu(CH_3COO)$ and $H_2O$ are generated. As a consequence, copper oxide molecules are separated from the Cu film. The same reaction occurs in the case of using another organic compound (organic acid) such as formic acid or propionic acid other than acetic acid. As a result, the Cu film is etched.

In one embodiment, the etch reagent 370 can comprise chemical compounds such as $CH_3COOH$. The spontaneous reaction between $Cu_xO$ and $CH_3COOH$ forming a volatile Cu product has been published in journals. The method of using a directional energetic O beam (Neutral Beam) to cause anisotropic Cu etching (with a hardmask) in a hfacH ambient (and more generally, an acid ambient) is known. However, the present inventors have discovered that the reactivity of $Cu_xO$ with $CH_3COOH$ is much higher than that with hfacH. For example, in an ambient pressure on the order of 1E(−5) torr of $CH_3COOH$ and room temperature substrate, a very high and manufacturing worthy removal rate of CIO is obtainable. For example, an ambient pressure of 3E(−5) torr of $CH_3COOH$ and anisotropic hyperthermal O, e.g., 100 eV forms $Cu_xO$ by the "sub-plantation" of the anisotropic hyperthermal O.

The net surface reactions between $CH_3COOH$ and oxidized Cu can be written as:

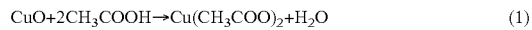

$$CuO + 2CH_3COOH \rightarrow Cu(CH_3COO)_2 + H_2O \qquad (1)$$

$$CU_2O + 4CH_3COOH \rightarrow 2Cu(CH_3COO)_2 + H_2O + H_2 \qquad (2)$$

According to Eqs. (1) and (2), $CH_3COOH$ reacts with oxidized Cu and forms Cu, and volatile $Cu(CH_3COO)_2 + H_2O$ etching products. Therefore, when $CH_3COOH$ is selected as the etch reagent 370 in FIG. 3, the volatile etch products 390 are $Cu(CH_3COO)_2$ and $H_2O$). The Cu etch product in Eq. (2) can undergo oxidation and subsequent reaction with $CH_3COOH$ according to Eqs. (1) or (2). $Cu(CH_3COO)_2$ is volatile at low temperatures and does not significantly redeposit on sidewalls of Cu etch features or on the process chamber walls.

An inert gas can be added to any one of the aforementioned process gas chemistries. The inert gas may include at least one of argon, helium, krypton, xenon, and nitrogen. For example, the addition of inert gas to the process chemistry is used to dilute the process gas or adjust the process gas partial pressure(s).

Transport of the gaseous $CH_3COOH$ etching gas to the processing chamber may be achieved using a delivery system that can comprise a bubbler system and a mass flow controller (MFC). The bubbler system can be used with or without a carrier gas such as argon (Ar). When a carrier gas is used, it is bubbled through the $CH_3COOH$ liquid and becomes saturated with the $CH_3COOH$ vapor. The partial pressure of the $CH_3COOH$ vapor in the process chamber is controlled by the temperature of the $CH_3COOH$ liquid in the bubbler. Exemplary gas flow rates of $CH_3COOH$ and a carrier gas are less than 1000 sccm, preferably being less than 500 sccm. Alternatively, a liquid injection system can be used to deliver the $CH_3COOH$ to the processing chamber. The handling and use of etch reagents such as $CH_3COOH$ reagents in this invention is well known in the art.

Nguyen and Chameski in U.S. Pat. No. 6,284,052 entitled "In-situ method of cleaning a metal-organic chemical vapor deposition chamber," describe a method to clean the interior surfaces, and especially the chuck, of a metal deposition chamber. The method first oxidizes the surface to be cleaned with an oxygen plasma, and then removes the oxide products as a vapor with the use of $CH_3COOH$.

Koide et al. in U.S. Pat. No. 5,993,679 entitled "Method of cleaning metallic films built up within thin film deposition chamber," describe a method that includes an oxidation step to oxidize a metallic film, a complexing step to complex the oxide film, and a sublimations step to sublimate the complex. The conditions of these cleaning steps are set so that the oxidations step is the rate determining step.

The focus of the current invention is to enable anisotropic etching of Cu layers and Cu-containing layers for patterning multilayer structures. The main purpose of the above-mentioned methods is to clean and remove metallic films from processing chambers through the formation of volatile etch products from the reaction of oxidized metal films with $CH_3COOH$.

Figure 4:
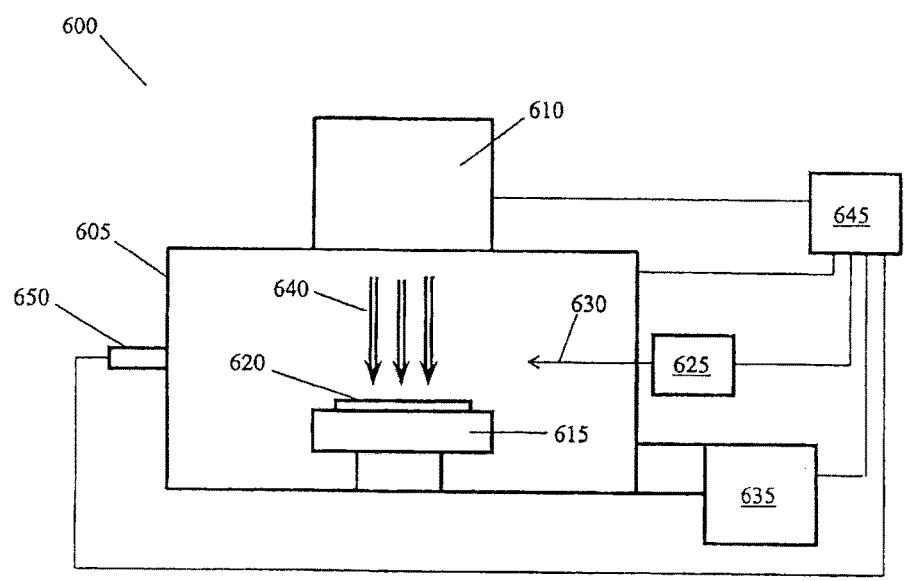
FIG. 4 shows a processing system according to a preferred embodiment of the present invention.

FIG. 4 shows a processing system according to a preferred embodiment of the present invention. The processing system 600 comprises a process chamber 605 and an O-atom beam source 610. The process chamber 605 comprises a substrate holder 615, upon which a substrate 620 to be processed is affixed, a gas injection system 625 for introducing process gases 630 to the process chamber 605, and a vacuum pumping system 635. For example, a gate valve shown) is used to throttle the vacuum pumping system 635. Process gases 630 are introduced via the gas injection system 625 and the process pressure is adjusted. The gas injection system 625 allows independent control over the delivery of process gases 630 to the process chamber from ex-situ gas sources. The process gases 630 can comprise etch reagents and inert gases. The O-atom beam source 610 generates a directional beam 640 of high kinetic energy neutral O-atoms that are introduced to the process chamber 605. The beam of O-atoms 640 etches a Cu-containing layer on the substrate 620 in the presence of the etch reagents as described in FIGS. 1-3.

Substrate 620 is transferred into and out of process chamber 605 through a slot valve (not shown) and chamber feed-through (not shown) via robotic substrate transfer system where it is received by substrate lift pins (not shown) housed within substrate holder 615 and mechanically translated by devices housed therein. Once the substrate 620 is received from the substrate transfer system, it is lowered to an upper surface of the substrate holder 615.

In an alternate embodiment, the substrate 620 is affixed to the substrate holder 615 via an electrostatic clamp (not shown). Furthermore, the substrate holder 615 further includes a cooling system including a re-circulating coolant flow that receives heat from the substrate holder 615 and transfers heat to a heat exchanger system (not shown), or when heating, transfers heat from the heat exchanger system. Moreover, gas may be delivered to the backside of the substrate to improve the gas-gap thermal conductance between the substrate 620 and the substrate holder 615. Such a system is utilized when temperature control of the substrate is required at elevated or reduced temperatures. Vacuum pump system 635 preferably includes a turbo-molecular vacuum pump (TMP) capable of a pumping speed up to 5000 liters per second (and greater) and a gate valve for throttling the chamber pressure.

A controller 645 includes a microprocessor, a memory, and a digital I/O port capable of generating control voltages sufficient to communicate and activate inputs to the processing system 600 as well as monitor outputs from the processing system 600. Moreover, the controller 645 is coupled to and exchanges information with the process chamber 605, the O-atom beam source 610, the process monitor system 650, the gas injection system 625 and the vacuum pump system 635. A program stored in the memory is utilized to control the aforementioned components of a processing system 600 according to a stored process recipe. One example of controller 645 is a digital signal processor (DSP), model number TMS320, available from Texas Instruments, Dallas, Tex.

The process monitor system 650 can comprise, for example, a mass spectrometer system to measure gaseous species, such as etch reagents and etch by-products in the processing environment. In general, the process monitor system 650 is a versatile diagnostic tool capable of performing multiple tasks such as process analysis and endpoint detection. The process monitor system 650, shown in FIG. 4, is attached to the processing chamber 605. In an alternate embodiment, the process monitor system is located downstream from the vacuum pump system 635. The process monitor system 650 can he used with controller 645 to determine the status of the etching process and provide feedback to ensure process compliance.

Examples of hyperthermal O-atom sources will now be described. Various methods and apparatus have been developed for generating a beam of neutral hyperthermal O-atoms. The dissociative ionization of molecular oxygen ($O_2$) supply gas to produce atomic oxygen can be carried out using optical laser-induced discharges, DC or AC arcs, inductive coupling, microwave, or electron bombardment discharges, that are usually in a separate chamber connected to the wafer processing chamber. O-ions that are formed from the dissociation of $O_2$ in the plasma are accelerated to the selected high kinetic energy and then charge neutralized, forming a beam of neutral hyperthermal O-atoms. The charge neutralization of the O-ions can be carried out using a variety of different method. An example is electron transfer from interaction of O-ions with metal surfaces at grazing incidence.

Chen and Yvonne in U.S. Pat. No. 6,331,701 entitled "RF-grounded sub-Debye neutralizer grid," describe apparatus for generating a hyperthermal beam of neutral O-atoms with kinetic energy ranging from 20 eV to 400 eV and a beam diameter of 1 inch to greater than 10 inches for processing large substrates. The hyperthermal beam is generated by passing accelerated oxygen ions from a RF-plasma through a neutralizer grid where the oxygen ions are charge neutralized through forward surface scattering. The hyperthermal beam has high flux of neutral O-atoms and a small divergent angle (~6-3°).

Optical laser-induced discharges can employ pulsed laser radiation as an energy source for dissociation the supply gas (e.g., $O_2$) in an expansion nozzle. The expansion creates a hyperthermal beam of neutral reactive species (e.g., O-atoms) that can be collimated using an orifice between the expansion chamber and the processing chamber.

Figure 5:
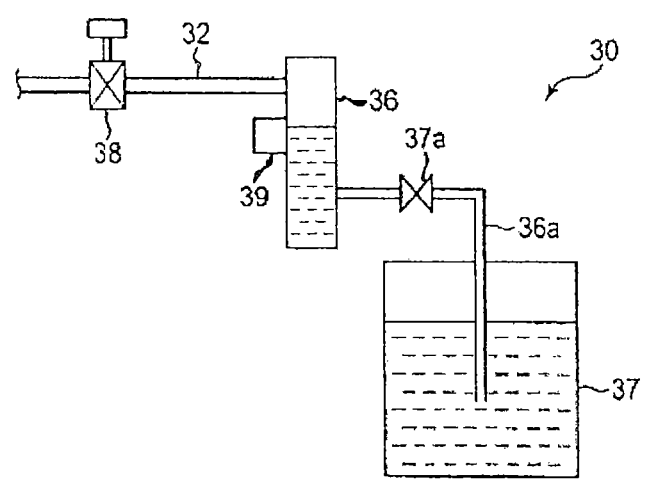
FIG. 5 shows an example of an organic compound gas supply unit in the etching apparatus of FIG. 4.

An organic compound gas is supplied from an organic compound gas supply unit into a target chamber. Here, an acetic acid as an organic acid is used as an example of the organic compound. FIG. 5 illustrates an example organic compound supply unit that may be used in accordance with embodiments of the invention. For example, the organic compound supply unit may be used as the gas injection system 625 in FIG. 4. As seen, the organic compound gas supply unit 30 includes an intermediate vessel 36 and a tank 37 for storing an organic compound, and a valve 37a is disposed on a line 36a for connecting the intermediate vessel 36 and the tank 37. The organic compound is supplied from the intermediate vessel 36 to the target chamber through the line 32, and the line 32 is provided with a variable leak valve 38. The intermediate vessel 36 has a sensor for detecting the amount of the organic compound therein, e.g., a liquid surface sensor 39, so that the amount of the organic compound in the intermediate vessel 36 is measured. When the lowering of the liquid surface is detected by the liquid surface sensor 39, the intermediate vessel 36 is disconnected from the vacuum by the variable leak valve 38 and an organic compound is supplied from the tank 37 to the intermediate vessel by opening the valve 37a.

The organic compound (acetic acid) in the reservoir 37 is evaporated, and the evaporated organic compound is supplied to the target chamber. At this time, the evaporation amount of the organic compound (acetic acid) is controlled by controlling an opening degree of the variable leak valve 38. The supply amount of the organic compound gas is set to a level that allows sufficient organic compound molecules to be adsorbed to the surface of the Cu film formed on the substrate. The pressure in the target chamber (partial pressure of acetic acid) is preferably about $10^{-4}$ Torr to $10^{-6}$ Torr. A pressure gauge may be, e. g. an ion gauge or a capacitance monometer.

As with the embodiments discussed above, the reducing gas comprises an acid such as $CH_3COOH$, and the reacting gas comprises 02. An inert gas such as He, Ne, Ar, Kr, and Xe may also be used. Further, the reacting gas and reducing gas may be introduced simultaneously into the plasma processing chamber, in a single-step process, or introduced sequentially into the plasma processing chamber, in a multi-step process.

It should be understood that various modifications and variations of the present invention may be employed in practicing the invention. It is therefore to be understood that, within the scope of the appended claims, the invention may be practiced otherwise than as specifically described herein.

The invention claimed is:

1. A method for etching a copper-containing layer on a substrate, comprising:
   loading a substrate into a processing chamber having a neutral beam source and a substrate holder, the substrate having a copper-containing layer and etch mask formed thereupon;
   exposing, at a pressure, the copper-containing layer to a directional neutral beam comprising a reacting gas, the reacting gas anisotropically forming a first copper-containing compound on a portion of exposed surfaces of features formed in the copper-containing layer based on directionality of the neutral beam;
   introducing, at said pressure, a reducing gas comprising a carboxylic acid into the processing chamber, proximate the substrate holder, the reducing gas spontaneously reacting with the first copper-containing compound to form a volatile second copper-containing compound; and
   pumping the volatile second copper-containing compound from the processing chamber, to anisotropically etch and form a pattern in the copper-containing layer,
   wherein a temperature of the substrate is maintained at room temperature and said pressure is maintained on the order of 1E(−5) Torr.

2. The method of claim 1, wherein the carboxylic acid comprises at least one of acetic acid, formic acid, propionic acid, butyric acid and valeric acid.

3. The method of claim 2, wherein the reducing gas comprises $CH_3COOH$.

4. The method of claim 1, wherein the reacting gas comprises $O_2$.

5. The method of claim 1, wherein the first copper-containing compound is preferentially formed at the bottom surfaces of features formed in the copper-containing layer.

6. The method of claim 1, further comprising introducing an inert gas into the processing chamber.

7. The method of claim 1, wherein the kinetic energy of the reacting gas of the neutral beam is between 1 meV and 1 keV.

8. The method of claim 1, wherein the kinetic energy of the reacting gas of the neutral beam is between 10 eV and 300 eV.

9. The method of claim 1, wherein the kinetic energy of the reacting gas of the neutral beam is between 50 meV and 1 eV.

10. The method of claim 1, wherein the divergence angle of the directional neutral beam of the reacting gas is less than about 20°.

11. The method of claim 10, wherein the divergence angle of the directional neutral beam of the reacting gas is less than about 10°.

12. The method according to claim 6, wherein the inert gas comprises at least one of argon, helium, xenon, and nitrogen.

13. The method of claim 1, wherein said exposing and introducing steps are performed at a same process pressure.

14. A method for anisotropically etching a Cu-containing layer comprising the steps of:
   loading a substrate into a vacuum chamber, the substrate comprising a Cu-containing layer overlying a substrate;
   introducing, at a pressure, a directional beam of neutral oxygen atoms having a kinetic energy between 100 eV and 1 eV;
   anisotropically oxidizing a portion of the Cu-containing layer by exposure to the beam of oxygen atoms based on directionality of the beam;
   introducing, at said pressure, a carboxylic acid gas spontaneously forming volatile etch products when reacted with the oxidized Cu-containing layer; and
   removing the etch products from the oxidized Cu-containing layer to anisotropically etch the Cu-containing layer,
   wherein a temperature of the substrate is maintained at room temperature and said pressure is maintained on the order of 1E(−5) Torr.

15. The method according to claim 14, wherein the carboxylic acid gas comprises $CH_3COOH$.

16. The method of claim 14, wherein said exposing and introducing steps are performed at a same process pressure.

17. A method for etching a copper-containing layer on a substrate, comprising:
   loading a substrate into a processing chamber having a neutral beam source and a substrate holder, the substrate having a copper-containing layer and etch mask formed thereupon;
   exposing, at a pressure, the copper-containing layer to a directional neutral beam comprising a reacting gas, the reacting gas anisotropically forming a first copper-containing compound on a portion of exposed surfaces of features formed in the copper-containing layer by based on directionality of the neutral beam;
   introducing, at said pressure, acetic acid gas into the processing chamber, proximate the substrate holder, the acetic acid gas spontaneously reacting with the first copper-containing compound to form a volatile copper-containing compound; and
   pumping the volatile copper-containing compound from the processing chamber, to anisotropically etch and form a pattern in the copper-containing layer,
   wherein a temperature of the substrate is maintained at room temperature and said pressure is maintained on the order of 1E(−5) Torr.

18. The method of claim 17, wherein the first copper-containing compound is preferentially formed at the bottom surfaces of features formed in the copper-containing layer.

19. The method of claim 17, wherein said exposing and introducing steps are performed at a same process pressure.

* * * * *